(12) United States Patent
Shao et al.

(10) Patent No.: US 10,915,690 B2
(45) Date of Patent: Feb. 9, 2021

(54) VIA DESIGN OPTIMIZATION TO IMPROVE VIA RESISTANCE

(71) Applicant: International Business Machines Corporation, Armonk, NY (US)

(72) Inventors: Dongbing Shao, Wappingers Falls, NY (US); Yongan Xu, Niskayuna, NY (US); Shyng-Tsong Chen, Rensselaer, NY (US); Zheng Xu, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/383,326

(22) Filed: Apr. 12, 2019

(65) Prior Publication Data

US 2020/0327208 A1 Oct. 15, 2020

(51) Int. Cl.
*G06F 30/30* (2020.01)
*G06F 30/398* (2020.01)

(52) U.S. Cl.
CPC .................. *G06F 30/398* (2020.01)

(58) Field of Classification Search
CPC .................................... G06F 30/398
USPC ....................................... 716/112
See application file for complete search history.

(56) References Cited

U.S. PATENT DOCUMENTS

| | | | |
|---|---|---|---|
| 6,532,581 B1 | 3/2003 | Toyonaga et al. | |
| 6,792,593 B2* | 9/2004 | Takashima | G03F 1/36 716/53 |
| 7,739,632 B2* | 6/2010 | Bergman Reuter | G06F 30/394 716/136 |
| 8,793,627 B1 | 7/2014 | Stephens et al. | |
| 9,209,129 B2 | 12/2015 | Rieger et al. | |
| 9,391,020 B2* | 7/2016 | Zhang | H01L 21/7681 |
| 9,553,018 B2 | 1/2017 | Bristol et al. | |
| 9,666,451 B2 | 5/2017 | Wallace et al. | |
| 9,672,311 B2* | 6/2017 | Hamouda | H01L 23/5226 |
| 9,747,401 B2 | 8/2017 | Hamouda | |
| 2011/0055791 A1* | 3/2011 | Gao | G06F 30/392 716/131 |
| 2017/0344692 A1 | 11/2017 | Oh et al. | |

* cited by examiner

*Primary Examiner* — Jack Chiang
*Assistant Examiner* — Brandon Bowers
(74) *Attorney, Agent, or Firm* — Erik Johnson; Otterstedt, Wallace & Kammer, LLP

(57) ABSTRACT

Methods and systems for performing an electronic design. A layout of a via of an electronic design is obtained and a determination is made if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via; and reducing a resistance of the via by the layout of the via is retargeted in response to the retargeting conditions being satisfied.

13 Claims, 7 Drawing Sheets

US 10,915,690 B2

VIA DESIGN OPTIMIZATION TO IMPROVE VIA RESISTANCE

BACKGROUND

The present invention relates to the electronic design of integrated circuits (ICs), and more specifically, to logical and physical synthesis of such circuits.

In VLSI (very large scale integration) digital design, electrical conductors (metal lines) interconnect the terminals of the electronic components (such as cells, elements, objects, and the like) in the integrated circuit, and vias are used to interconnect the metal lines. The resistance of the vias that interconnect the metal lines is an important aspect of the performance of the VLSI circuit. Indeed, via resistance is typically a dominating factor in back-end-of-line (BEOL) overall resistance.

SUMMARY

Principles of the invention provide techniques for design optimization that reduce the resistance of a via. In one aspect, an exemplary method includes the step of obtaining a layout of a via of an electronic design; determining if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via; and reducing a resistance of the via by retargeting the layout of the via in response to the retargeting conditions being satisfied.

In one aspect, an exemplary non-transitory computer readable medium comprises computer executable instructions which when executed by a computer performing electronic design analysis cause the computer to perform a method which improves the performance of the computer, the method comprising operations of: obtaining a layout of a via of an electronic design; determining if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via; and reducing a resistance of the via by retargeting the layout of the via in response to the retargeting conditions being satisfied.

In one aspect, an exemplary computer comprises a memory; and at least one processor, coupled to said memory, and operative to perform operations comprising: obtaining a layout of a via of an electronic design; determining if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via; and reducing a resistance of the via by retargeting the layout of the via in response to the retargeting conditions being satisfied.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

One or more embodiments of the invention or elements thereof can be implemented in the form of a computer program product including a computer readable storage medium with computer usable program code for performing the method steps indicated. Furthermore, one or more embodiments of the invention or elements thereof can be implemented in the form of a system (or apparatus) (e.g., a computer) including a memory, and at least one processor that is coupled to the memory and operative to perform exemplary method steps. Yet further, in another aspect, one or more embodiments of the invention or elements thereof can be implemented in the form of means for carrying out one or more of the method steps described herein; the means can include (i) hardware module(s), (ii) software module(s) stored in a computer readable storage medium (or multiple such media) and implemented on a hardware processor, or (iii) a combination of (i) and (ii); any of (i)-(iii) implement the specific techniques set forth herein.

Techniques of the present invention can provide substantial beneficial technical effects. For example, one or more embodiments provide one or more of:

improved via design in VLSI designs;
reduced via resistance in VLSI designs;
automatic electronic design automation (EDA) flow for increased efficiency; and
retargeting of via layouts in VLSI designs.

These and other features and advantages of the present invention will become apparent from the following detailed description of illustrative embodiments thereof, which is to be read in connection with the accompanying drawings.

DETAILED DESCRIPTION

Figure 1A:
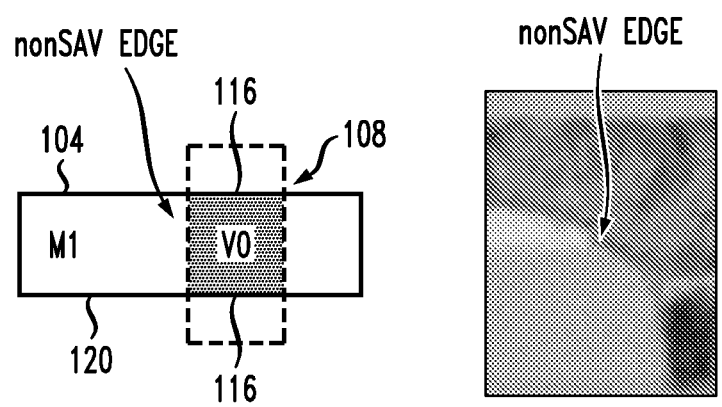
FIGS. 1A-1C illustrate several examples of a metal line intersecting a via in a VLSI design.
Figure 1B:
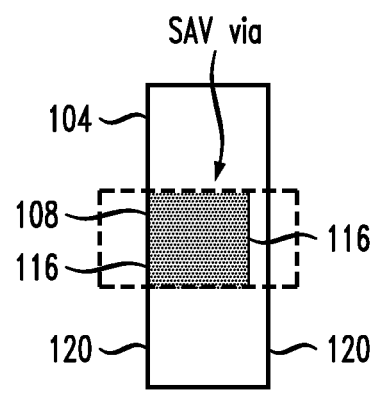
Figure 1C:
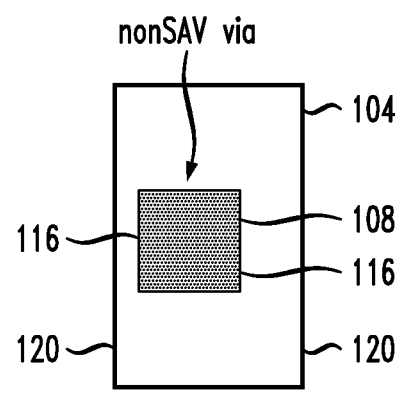

One or more embodiments advantageously provide techniques for optimizing the design of vias in a VLSI digital design. FIGS. 1A-1C illustrate several examples of a metal line 104 intersecting a via 108 in a VLSI design. FIG. 1A illustrates (schematic and photograph) a via 108 where two of the actual via edges 116 of the via 108 are defined by the intersection of the metal line 104 and the via 108. FIG. 1B illustrates a via 108 where one of the edges 116 of the via 108 is defined by the intersection of the metal line 104 prior to retargeting and two of the edges 116 are defined by the intersection of the metal line 104 after retargeting. The area is larger compared to FIG. 1A. The square via in FIG. 1B will be retargeted to the dashed rectangle shape and etched down into metal trenches. Accordingly, imagine the dashed rectangle as a pin hole and through it both metal edges can be seen. FIG. 1C illustrates a via 108 where none of the edges 116 of the via 108 are defined by the intersection of the metal line 104. In general, the greater the area of the via 108, the lower the resistance of the via 108 and the higher the performance of the VLSI design. Via resistance is typically a dominating factor in back-end-of-line (BEOL) overall resistance.

In one example embodiment, a self-aligned via (SAV) process redesigns (retargets) a via square as a bar shape perpendicular to the metal line 104 that is located above the via 108, if certain conditions are satisfied. For example, if both edges 116 of the via 108 are within 0.006 μm of the corresponding edges 120 of the metal line 104, the SAV process retargets the via square. Thus, the via 108 of FIG. 1B would be subject to retargeting while the via 108 of FIG. 1C would not be subject to retargeting.

Figure 2A:
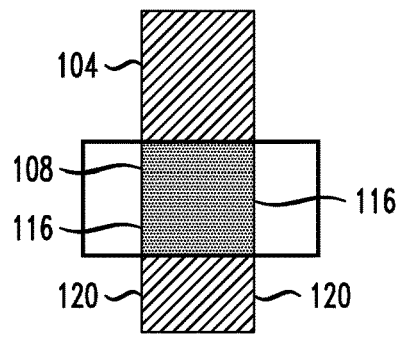
FIGS. 2A-2C illustrate several examples of a metal line intersecting a via in a VLSI design, in accordance with an example embodiment.
Figure 2B:
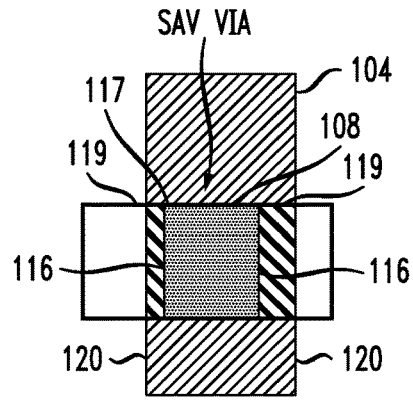
Figure 2C:
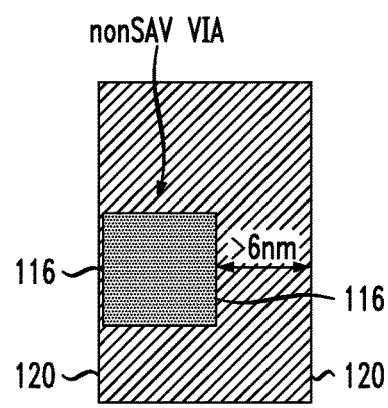

FIGS. 2A-2C illustrate several examples of a metal line 104 intersecting a via 108 in a VLSI design, in accordance with an example embodiment. FIG. 2A illustrates a via 108 where two of the edges 116 of the via 108 are defined by the intersection of the metal line 104; while the SAV process provides the benefit of a via overlay compensation, the via design is not replaced. FIG. 2B illustrates an example where the via 108 has been retargeted and the new edges 116 of the retargeted via 108 are defined by the intersection of the metal line 104 through the use of a different (larger) via design, thus providing a larger via area. (In FIG. 2B, the square 117 represents the via 108 prior to retargeting and the cross-hatched area 119 represents the area of the via 108 that has been added by the retargeting.) FIG. 2C illustrates a via 108 where the via 108 did not satisfy the conditions to qualify for retargeting. For example, at least one of the edges 116 of the via 108 is greater than 0.006 (6 nm) from the corresponding edge 120 of the metal line 104, making it a non-SAV via.

Figure 3:
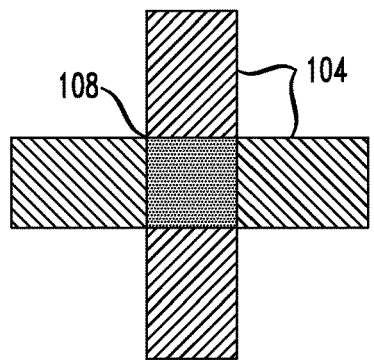
FIG. 3 is a cross-sectional view of the intersection of the metal line and a via, in accordance with an example embodiment.
Figure 3:
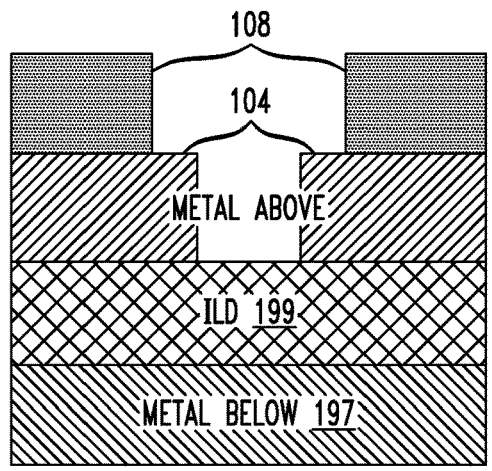

FIG. 3 is a cross-sectional view of the intersection of the metal line 104 and the via 108, in accordance with an example embodiment. As illustrated in FIG. 3, when the edge of the via 108 is not defined by the intersection with the metal line 104, a large sidewall angle is observed above the inter-level dielectric (ILD) 199; note also the metal below layer 197.

Figure 4:
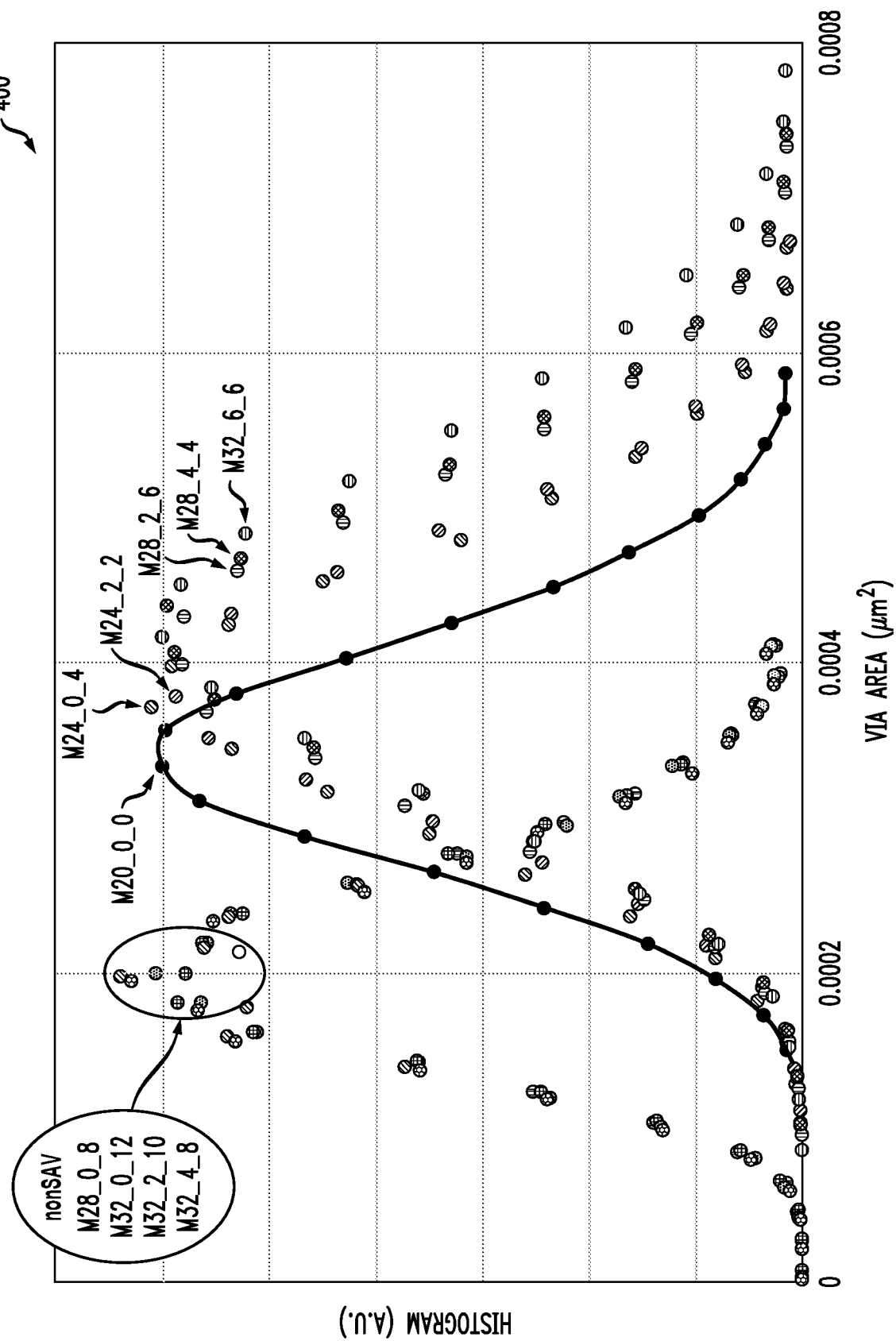
FIG. 4 is a histogram of via contact area at different metal line widths, in accordance with an example embodiment.

FIG. 4 is a histogram 400 of contact area of the via 108 for different widths of the metal line 104, in accordance with an example embodiment with via area (μm²) on the horizontal axis and a count of cases having the corresponding via area defined by the vertical axis. The results are generated by performing a Monte-Carlo simulation using the SAV process and the example conditions described above. The labels are of the form Mw_x_y where w is the width (in nm) of the corresponding metal line 104, x is the distance (in nm) between a first edge of the via 108 and a first edge 120 of the metal line 104, and y is the distance (in nm) between a second edge of the via 108 and a second edge 120 of the metal line 104. The solid line represents the nominal results for a metal line 104 with a 20 nm width that aligned with the via 108, assuming 20 nm is the minimum metal width allowed. The example plots which peak(s) to the left of the nominal line (less contact area of the via 108) correspond to the vias 108 that did not qualify for the SAV retargeting, i.e. a non-SAV design. The example plots which peak(s) to the right of the nominal line (more contact area of the via 108) correspond to the vias 108 that qualified for the SAV retargeting, i.e. an SAV design. As illustrated in FIG. 4, the area of the non-SAV via designs 108 is approximately 60% of the nominal value. In addition, a wider metal line 104 can typically increase the contact area of the via 108 by approximately 10-25%. Thus, in terms of the area and resistance of the via 108, a wider metal line 104 is beneficial compared to a narrower metal line 104.

Figure 5:
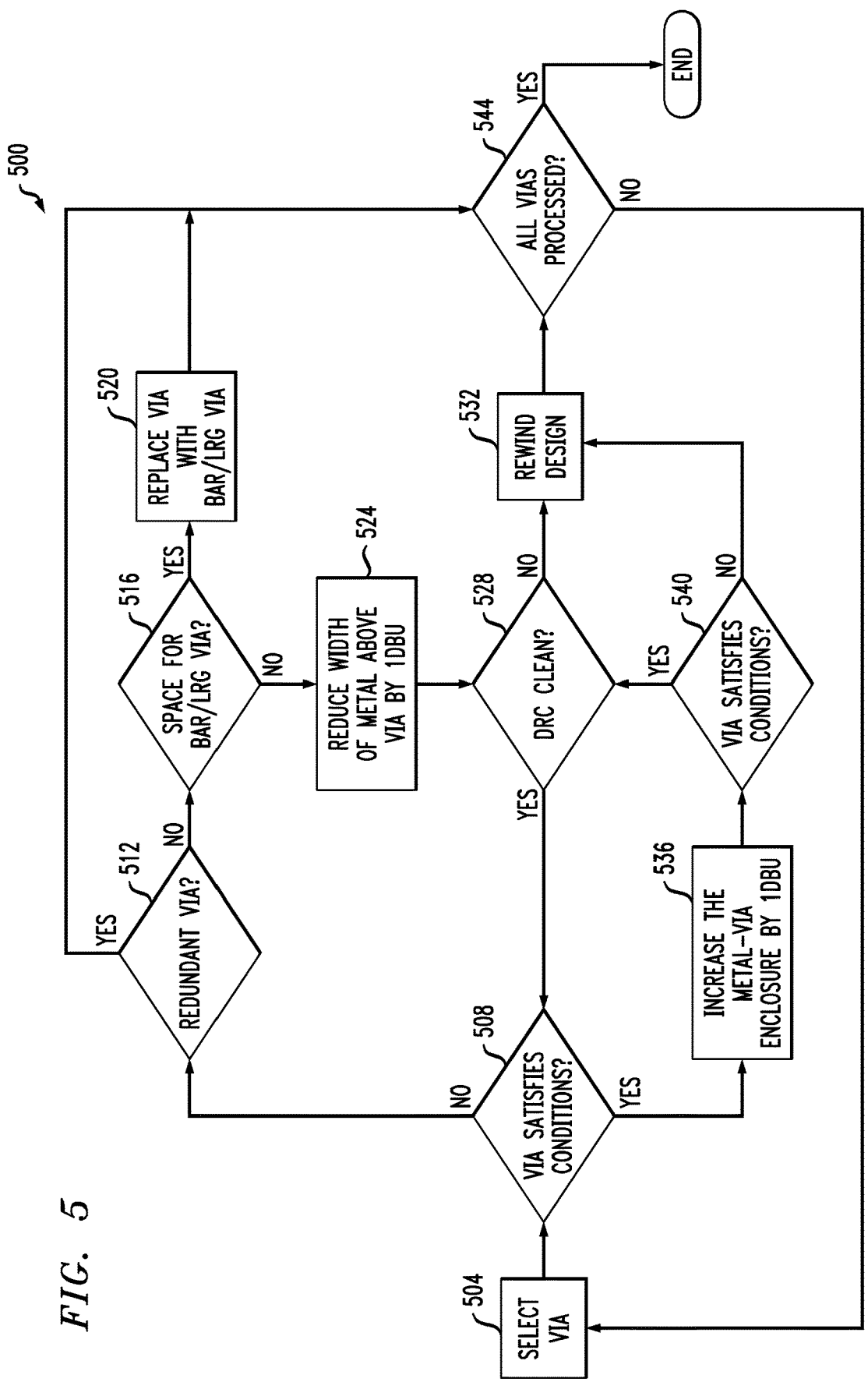
FIG. 5 is a flowchart of an example method for optimizing a design of a via, in accordance with an example embodiment.

FIG. 5 is a flowchart of an example method 500 for optimizing a design of the via 108, in accordance with an example embodiment. In one example embodiment, a via 108 of a VLSI design is selected (operation 504). A check is performed to determine if the selected via 108 qualifies for the SAV process (operation 508). For example, a check can be performed to determine if both edges 116 of the via 108 that are parallel to the edges 120 of the metal line 104 are within the specified distance. If the selected via 108 qualifies for the SAV process, the method 500 proceeds with operation 536 (YES branch of block 508). If the selected via 108 does not qualify for the SAV process (NO branch of block 508), a check is performed to determine if the via 108 is a redundant via (operation 512). If the selected via 108 is a redundant via (YES branch of block 512), the method 500 proceeds with operation 544. If the selected via 108 is not a redundant via (NO branch of block 512), a check is performed to determine if space exists for a BAR or LRG via design (operation 516). If space exists for a BAR or LRG via design (YES branch of 516), the via 108 is replaced with the largest of the BAR and LRG via designs that will fit in the available space (operation 520) and the method 500 proceeds with operation 544. If space does not exist for a BAR or LRG via design (NO branch of block 516), the width of the metal line 104 above the via 108 is reduced by 1 design unit (DBU) (operation 524) and the method 500 proceeds with operation 528. As will be appreciated by the skilled artisan, given the teachings herein, BAR and LRG refer respectively to via bar and via large, two other types of via designs usually allowed, which are larger than regular vias.

During operation 536, the metal-via enclosure is increased by 1 DBU and a check is performed to determine if the selected via 108 qualifies for the SAV process (operation 540). If the selected via 108 does not qualify for the SAV process (NO branch of block 540), the design is rewound to the previous state (the metal-via enclosure is decreased by 1 DBU; operation 532) and the method 500 proceeds with operation 544. If the selected via 108 qualifies for the SAV process (YES branch of block 540), a check (known herein as a design rule check or DRC) is performed to determine if the design rules for the VLSI design are satisfied (known as being "clean" here) (operation 528).

During operation 528, as noted, a check is performed to determine if the DRC is clean. If the DRC is clean (YES branch of block 528), the method 500 proceeds with operation 508. If the DRC is not clean (NO branch of block 528), the method 500 proceeds with operation 532 and the design is rewound to the previous state.

During operation 544, a check is performed to determine if all the vias 108 in the VLSI design have been processed. If all the vias 108 in the VLSI design have not been processed (NO branch of block 544), the method 500 proceeds with operation 504; otherwise (YES branch of block 544), the method 500 ends.

In one aspect, an exemplary method includes the step of obtaining a layout of a via (108) of an electronic design (504); determining if the layout of the via (108) satisfies one or more retargeting conditions (508), at least one of the retargeting conditions being that a first edge (120) of a metal line (104) is within a specified distance from a first edge (116) of the via (108) and a second edge (120) of the metal line (104) is within the specified distance from a second edge (116) of the via (108), the first edge (120) of the metal line (104) being parallel to the first edge (116) of the via (108) and the second edge (120) of the metal line (104) being parallel to the second edge (116) of the via (108); and reducing a resistance of the via (108) by retargeting the layout of the via (108) in response to the retargeting conditions being satisfied (such as 520).

In one aspect, an exemplary non-transitory computer readable medium comprises computer executable instructions which when executed by a computer performing electronic design analysis cause the computer to perform a method which improves the performance of the computer, the method comprising operations of: obtaining a layout of a via (108) of an electronic design (504); determining if the layout of the via (108) satisfies one or more retargeting conditions (508), at least one of the retargeting conditions being that a first edge (120) of a metal line (104) is within a specified distance from a first edge (116) of the via (108) and a second edge (120) of the metal line (104) is within the specified distance from a second edge (116) of the via (108), the first edge (120) of the metal line (104) being parallel to the first edge (116) of the via (108) and the second edge (120) of the metal line (104) being parallel to the second edge (116) of the via (108); and reducing a resistance of the via (108) by retargeting the layout of the via (108) in response to the retargeting conditions being satisfied (such as 520).

In one aspect, an exemplary computer comprises a memory; and at least one processor, coupled to said memory, and operative to perform operations comprising: obtaining a layout of a via (108) of an electronic design (504); determining if the layout of the via (108) satisfies one or more retargeting conditions (508), at least one of the retargeting conditions being that a first edge (120) of a metal line (104) is within a specified distance from a first edge (116) of the via (108) and a second edge (120) of the metal line (104) is within the specified distance from a second edge (116) of the via (108), the first edge (120) of the metal line (104) being parallel to the first edge (116) of the via (108) and the second edge (120) of the metal line (104) being parallel to the second edge (116) of the via (108); and reducing a resistance of the via (108) by retargeting the layout of the via (108) in response to the retargeting conditions being satisfied (such as 520).

In one example embodiment, a check is performed to determine if the via is a redundant via in response to the retargeting conditions not being satisfied (512). In one example embodiment, a check is performed to determine if space is available for a larger via design in response to the via not being a redundant via (516). In one example embodiment, the via is replaced with a largest available via design that will fit in the available space in response to space being available for the larger via design (520).

In one example embodiment, a width of a metal line above the via is reduced by one design unit (DBU) in response to space not being available for the larger via design (524). In one example embodiment, a determination is made if the retargeted layout of the via satisfies the one or more retargeting conditions (540); the electronic design is rewound in response to the retargeted layout of the via not satisfying the one or more retargeting conditions (532); and a check is performed to determine if a design rule check (DRC) is satisfied in response to the retargeted layout of the via satisfying the one or more retargeting conditions (528). In one example embodiment, the obtaining, determining, and retargeting operations are repeated for each via of the electronic design.

In one example embodiment, the electronic design (910) is rendered in a design language; and logic synthesis is carried out on the electronic design rendered in the design language (903). In one example embodiment, timing optimizations are carried out on an analytical placement for the electronic design (907, 909), routing is carried out based on the timing optimizations (911), and a layout is prepared based on the routing (919), the routing being based on the retargeted layout of the via (108). In one example embodiment, the layout is instantiated as a design structure (921). In one example embodiment, a physical integrated circuit is fabricated in accordance with the design structure.

As noted, in one or more embodiments, the layout is instantiated as a design structure. See discussion of FIG. 6 below ("EXEMPLARY DESIGN PROCESS USED IN SEMICONDUCTOR DESIGN, MANUFACTURE, AND/OR TEST"). A physical integrated circuit is then fabricated in accordance with the design structure. See again discussion of FIG. 6. Refer also to FIG. 7. Once the physical design data is obtained, based, in part, on the analytical processes described herein, an integrated circuit designed in accordance therewith can be fabricated according to known processes that are generally described with reference to FIG. 7. Generally, a wafer with multiple copies of the final design is fabricated and cut (i.e., diced) such that each die is one copy of the integrated circuit. At block 810, the processes include fabricating masks for lithography based on the finalized physical layout. At block 820, fabricating the wafer includes using the masks to perform photolithography and etching. Once the wafer is diced, testing and sorting each die is performed at 830 to filter out any faulty die.

Figure 9:
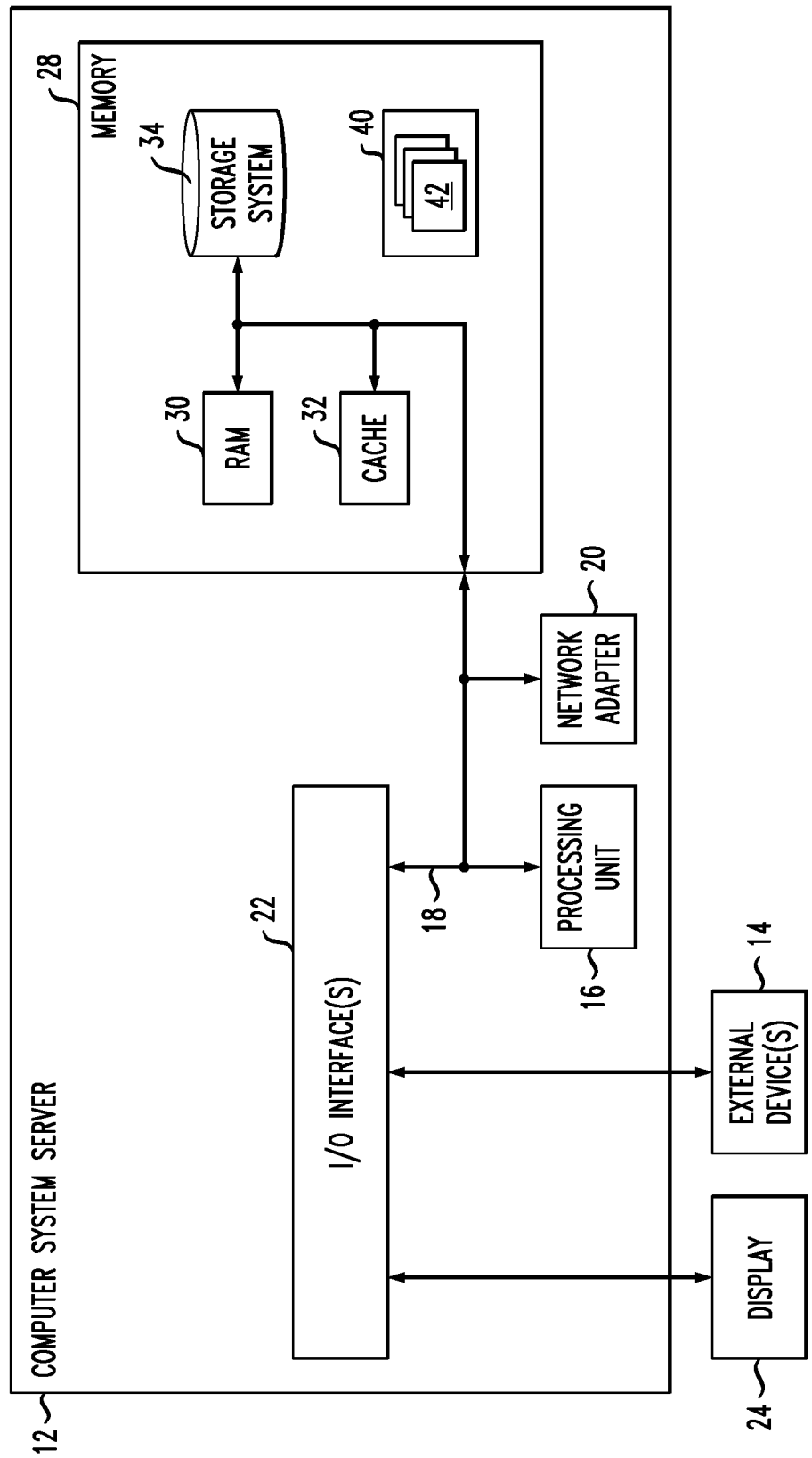
FIG. 9 depicts a computer system that may be useful in implementing one or more aspects and/or elements of the invention

One or more embodiments include a computer including a memory 28; and at least one processor 16, coupled to the memory, and operative to carry out or otherwise facilitate any one, some, or all of the method steps described herein (as depicted in FIG. 9, discussed in greater detail elsewhere herein).

Figure 6:
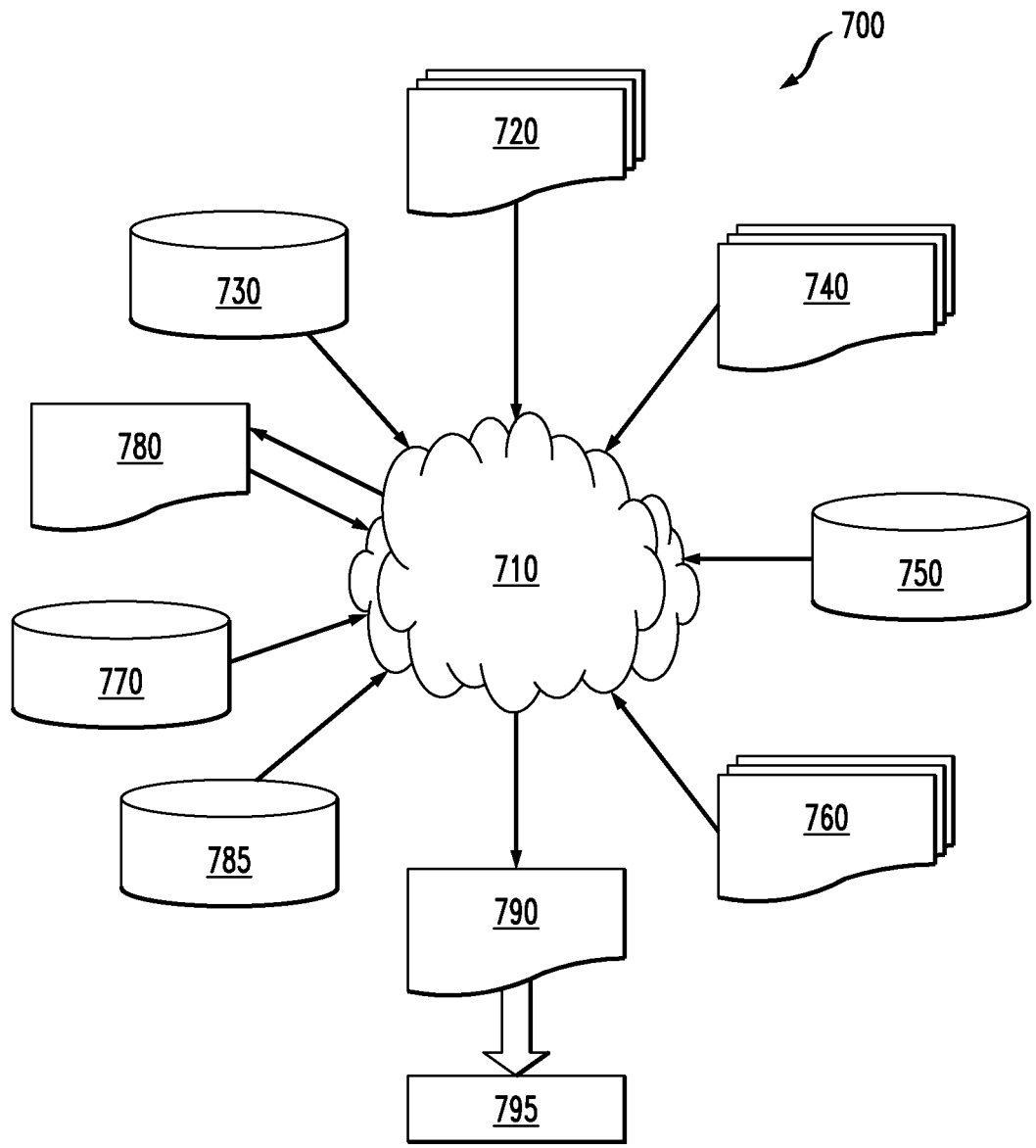
FIG. 6 is a flow diagram of a design process used in semiconductor design, manufacture, and/or test.
Figure 7:
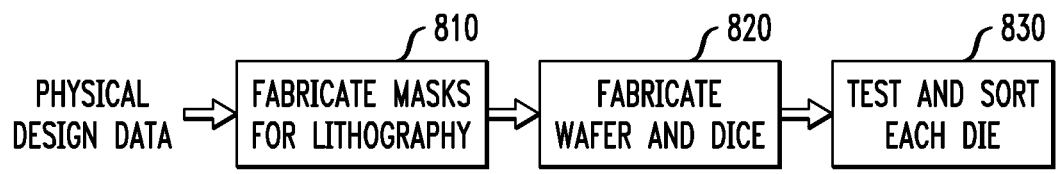
FIG. 7 shows further aspects of IC fabrication from physical design data.

Furthermore, referring to FIG. 6, in one or more embodiments the at least one processor is operative to generate a design structure for the integrated circuit design in accordance with the analysis, and in at least some embodiments, the at least one processor is further operative to control integrated circuit manufacturing equipment to fabricate a physical integrated circuit in accordance with the design structure. Thus, the layout can be instantiated as a design structure, and the design structure can be provided to fabrication equipment to facilitate fabrication of a physical integrated circuit in accordance with the design structure. The physical integrated circuit will be improved (for example, because of reduced via resistance) compared to circuits designed using prior art techniques.

Figure 8:
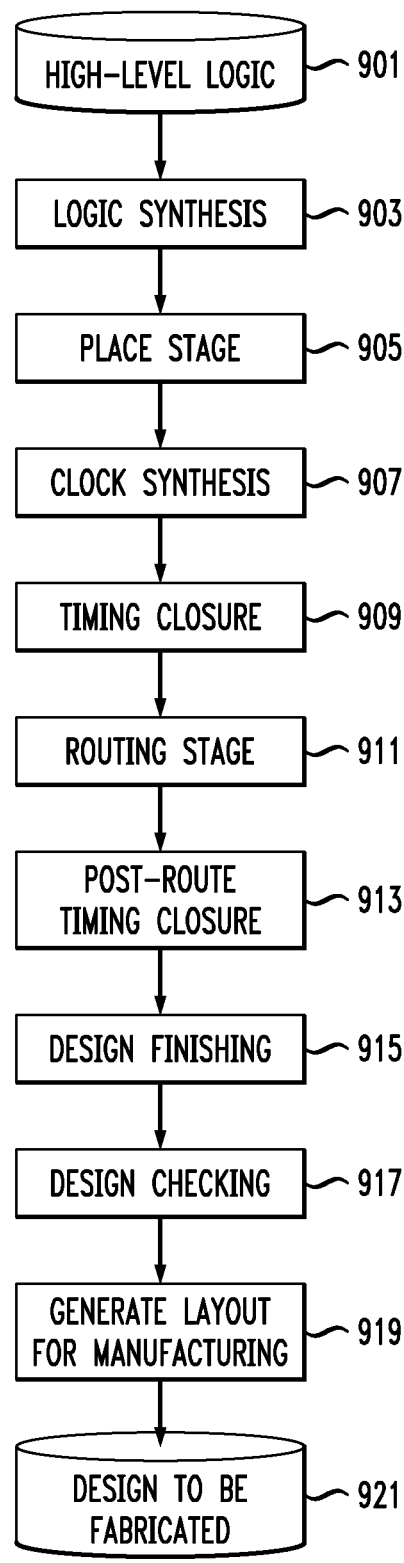
FIG. 8 shows an exemplary high-level Electronic Design Automation (EDA) tool flow, within which aspects of the invention can be employed.

FIG. 8 depicts an example high-level Electronic Design Automation (EDA) tool flow, which is responsible for creating an optimized microprocessor (or other IC) design to be manufactured. A designer could start with a high-level logic description 901 of the circuit (e.g. VHDL or Verilog).

The logic synthesis tool 903 compiles the logic, and optimizes it without any sense of its physical representation, and with estimated timing information. The placement tool 905 takes the logical description and places each component, looking to minimize congestion in each area of the design. The clock synthesis tool 907 optimizes the clock tree network by cloning/balancing/buffering the latches or registers. The timing closure step 909 performs a number of optimizations on the design, including buffering, wire tuning, and circuit repowering; its goal is to produce a design which is routable, without timing violations, and without excess power consumption. The routing stage 911 takes the placed/optimized design, and determines how to create wires to connect all of the components, without causing manufacturing violations. Post-route timing closure 913 performs another set of optimizations to resolve any violations that are remaining after the routing. Design finishing 915 then adds extra metal shapes to the netlist, to conform with manufacturing requirements. The checking steps 917 analyze whether the design is violating any requirements such as manufacturing, timing, power, electromigration or noise, and the like. When the design is clean, the final step 919 is to generate a layout for the design, representing all the shapes to be fabricated in the design to be fabricated 921.

One or more embodiments of the invention, or elements thereof, can be implemented in the form of an apparatus including a memory and at least one processor that is coupled to the memory and operative to perform exemplary method steps. FIG. 9 depicts a computer system that may be useful in implementing one or more aspects and/or elements of the invention; it is referred to herein as a cloud computing node but is also representative of a server, general purpose-computer, etc. which may be provided in a cloud or locally.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 9, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Thus, one or more embodiments can make use of software running on a general purpose computer or workstation. With reference to FIG. 9, such an implementation might employ, for example, a processor 16, a memory 28, and an input/output interface 22 to a display 24 and external device(s) 14 such as a keyboard, a pointing device, or the like. The term "processor" as used herein is intended to include any processing device, such as, for example, one that includes a CPU (central processing unit) and/or other forms of processing circuitry. Further, the term "processor" may refer to more than one individual processor. The term "memory" is intended to include memory associated with a processor or CPU, such as, for example, RAM (random access memory) 30, ROM (read only memory), a fixed memory device (for example, hard drive 34), a removable memory device (for example, diskette), a flash memory and the like. In addition, the phrase "input/output interface" as used herein, is intended to contemplate an interface to, for example, one or more mechanisms for inputting data to the processing unit (for example, mouse), and one or more mechanisms for providing results associated with the processing unit (for example, printer). The processor 16, memory 28, and input/output interface 22 can be interconnected, for example, via bus 18 as part of a data processing unit 12. Suitable interconnections, for example via bus 18, can also be provided to a network interface 20, such as a network card, which can be provided to interface with a computer network, and to a media interface, such as a diskette or CD-ROM drive, which can be provided to interface with suitable media.

Accordingly, computer software including instructions or code for performing the methodologies of the invention, as described herein, may be stored in one or more of the associated memory devices (for example, ROM, fixed or removable memory) and, when ready to be utilized, loaded in part or in whole (for example, into RAM) and implemented by a CPU. Such software could include, but is not limited to, firmware, resident software, microcode, and the like.

A data processing system suitable for storing and/or executing program code will include at least one processor 16 coupled directly or indirectly to memory elements 28 through a system bus 18. The memory elements can include local memory employed during actual implementation of the program code, bulk storage, and cache memories 32 which provide temporary storage of at least some program code in order to reduce the number of times code must be retrieved from bulk storage during implementation.

Input/output or I/O devices (including but not limited to keyboards, displays, pointing devices, and the like) can be coupled to the system either directly or through intervening I/O controllers.

Network adapters 20 may also be coupled to the system to enable the data processing system to become coupled to other data processing systems or remote printers or storage devices through intervening private or public networks. Modems, cable modem and Ethernet cards are just a few of the currently available types of network adapters.

As used herein, including the claims, a "server" includes a physical data processing system (for example, system 12 as shown in FIG. 9) running a server program. It will be understood that such a physical server may or may not include a display and keyboard.

It should be noted that any of the methods described herein can include an additional step of providing a system comprising distinct software modules embodied on a computer readable storage medium; the modules can include, for example, any or all of the appropriate elements depicted in the block diagrams and/or described herein; by way of example and not limitation, any one, some or all of the modules/blocks and or sub-modules/sub-blocks described. The method steps can then be carried out using the distinct software modules and/or sub-modules of the system, as described above, executing on one or more hardware processors such as 16. Further, a computer program product can include a computer-readable storage medium with code adapted to be implemented to carry out one or more method steps described herein, including the provision of the system with the distinct software modules.

One example of user interface that could be employed in some cases is hypertext markup language (HTML) code served out by a server or the like, to a browser of a computing device of a user. The HTML is parsed by the browser on the user's computing device to create a graphical user interface (GUI).

Exemplary System and Article of Manufacture Details

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Exemplary Design Process Used in Semiconductor Design, Manufacture, and/or Test

One or more embodiments integrate the characterizing and simulating techniques herein with semiconductor integrated circuit design simulation, test, layout, and/or manufacture. In this regard, FIG. 6 shows a block diagram of an exemplary design flow 700 used for example, in semiconductor IC logic design, simulation, test, layout, and manufacture. Design flow 700 includes processes, machines and/or mechanisms for processing design structures or devices to generate logically or otherwise functionally equivalent representations of design structures and/or devices, such as those that can be analyzed using techniques disclosed herein or the like. The design structures processed and/or generated by design flow 700 may be encoded on machine-readable storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a gate array or storage medium or the like, design structure 720 may be accessed and processed by one or more hardware and/or software modules within design process 710 to simulate or otherwise functionally represent an electronic component, circuit, electronic or logic module, apparatus, device, or system. As such, design structure 720 may comprise files or other data structures including human and/or machine-readable source code, compiled structures, and computer executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of components, circuits, devices, or logic structures to generate a Netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a nonvolatile storage medium such as a magnetic or optical disk drive, a programmable gate array, a compact flash, or other flash memory. Additionally, or in the alternative, the medium may be a system or cache memory, buffer space, or other suitable memory.

Design process 710 may include hardware and software modules for processing a variety of input data structure types including Netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on data storage media and that when processed by an ECAD system generate a logically or otherwise functionally equivalent form of one or more IC designs or the like. In one embodiment, design structure 790 may comprise a compiled, executable HDL simulation model that functionally simulates the devices to be analyzed.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described herein (e.g., .lib files). Design structure 790 may then proceed to a stage 795 where, for example, design structure 790: proceeds to tape-out, is released to manufacturing, is released to a mask house, is sent to another design house, is sent back to the customer, etc.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for performing an electronic design, comprising:
   obtaining a layout of a via of an electronic design;
   determining if the layout of the via satisfies one or more retargeting conditions qualifying the via for a self-aligned via process, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via;
   in response to the retargeting conditions not being satisfied, adjusting a width of a metal line above the via until the via qualifies for the self-aligned via process; and
   adjusting a metal-via enclosure dimension while the via qualifies for the self-aligned via process.

2. The method of claim 1,
   further comprising repeating the obtaining and determining steps for a second via of the electronic design, and performing a check to determine if the second via is a redundant via in response to the retargeting conditions not being satisfied.

3. The method of claim 2, further comprising performing a check to determine if space is available for a larger via design in response to the second via not being a redundant via.

4. The method of claim 3, further comprising replacing the second via with a largest available via design that will fit in the available space in response to space being available for the larger via design.

5. The method of claim 3, further comprising reducing a width of a metal line above the second via by one design unit (DBU) in response to space not being available for the larger via design.

6. A method for performing an electronic design, comprising:
   obtaining a layout of a via of an electronic design;
   determining if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via; and
   reducing a resistance of the via by retargeting the layout of the via in response to the retargeting conditions being satisfied;
   further comprising determining if the retargeted layout of the via satisfies the one or more retargeting conditions;
   rewinding the electronic design in response to the retargeted layout of the via not satisfying the one or more retargeting conditions; and
   performing a check to determine if a design rule check (DRC) is satisfied in response to the retargeted layout of the via satisfying the one or more retargeting conditions.

7. The method of claim 1, further comprising fabricating a physical integrated circuit in accordance with the electronic design.

8. The method of claim 1, further comprising:
   rendering the electronic design in a design language; and
   carrying out logic synthesis on the electronic design rendered in the design language.

9. The method of claim 8, further comprising:
   carrying out timing optimizations on an analytical placement for the electronic design;
   carrying out routing based on the timing optimizations; and
   preparing a layout based on the routing, the routing being based on the retargeted layout of the via.

10. The method of claim 9, further comprising:
    instantiating the layout as a design structure.

11. The method of claim 10, further comprising fabricating a physical integrated circuit in accordance with the design structure.

12. A non-transitory computer readable medium comprising computer executable instructions which when executed by a computer performing electronic design analysis cause the computer to perform a method which improves the performance of the computer, the method comprising operations of:
    obtaining a layout of a via of an electronic design;
    determining if the layout of the via satisfies one or more retargeting conditions, at least one of the retargeting conditions being that a first edge of a metal line is within a specified distance from a first edge of the via and a second edge of the metal line is within the specified distance from a second edge of the via, the first edge of the metal line being parallel to the first edge of the via and the second edge of the metal line being parallel to the second edge of the via;
    in response to the retargeting conditions not being satisfied, adjusting a width of a metal line above the via until the via qualifies for the self-aligned via process; and
    adjusting a metal-via enclosure dimension while the via qualifies for the self-aligned via process.

13. The non-transitory computer readable medium of claim 12, the operations further comprising repeating the obtaining and determining operations for a second via of the electronic design, and performing a check to determine if the second via is a redundant via in response to the retargeting conditions not being satisfied.

* * * * *